United States Patent
Meusel et al.

(10) Patent No.: US 11,374,140 B2
(45) Date of Patent: Jun. 28, 2022

(54) MONOLITHIC METAMORPHIC MULTI-JUNCTION SOLAR CELL

(71) Applicant: AZUR SPACE Solar Power GmbH, Heilbronn (DE)

(72) Inventors: Matthias Meusel, Heilbronn (DE); Alexander Berg, Heilbronn (DE); Philipp Schroth, Eichelberg (DE); Susanne Schreier, Besigheim (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/373,254

(22) Filed: Jul. 12, 2021

(65) Prior Publication Data
US 2022/0013678 A1    Jan. 13, 2022

(30) Foreign Application Priority Data
Jul. 10, 2020 (EP) ..................... 20000251

(51) Int. Cl.
*H01L 31/0725* (2012.01)
*H01L 31/0735* (2012.01)

(52) U.S. Cl.
CPC ...... *H01L 31/0725* (2013.01); *H01L 31/0735* (2013.01)

(58) Field of Classification Search
CPC ......................... H01L 31/0725; H01L 31/0735
See application file for complete search history.

(56) References Cited

U.S. PATENT DOCUMENTS

| | | | | |
|---|---|---|---|---|
| 4,385,198 A | * | 5/1983 | Rahilly | H01L 31/074 136/249 |
| 5,019,177 A | * | 5/1991 | Wanlass | H01L 31/043 257/E31.022 |
| 6,300,558 B1 | * | 10/2001 | Takamoto | H01L 31/0735 136/261 |
| 6,316,715 B1 | * | 11/2001 | King | H01L 31/0304 136/261 |
| 6,660,928 B1 | | 12/2003 | Patton et al. | |
| 10,991,840 B2 | | 4/2021 | Ebel et al. | |

(Continued)

FOREIGN PATENT DOCUMENTS

| | | |
|---|---|---|
| DE | 102018203509 A1 | 7/2019 |
| EP | 2960950 A1 | 12/2015 |
| EP | 3179521 A1 | 6/2017 |

OTHER PUBLICATIONS

Hoehn et al : Development of Germanium-Based Wafer-Bonded Four-Junction Solar Cells, IEEE Journal of Photovoltaics, vol. 9 No. 6, Oct. 11, 2019, ISSN: 2156-3381.

(Continued)

*Primary Examiner* — Golam Mowla
(74) *Attorney, Agent, or Firm* — Muncy, Geissler, Olds & Lowe, P.C.

(57) ABSTRACT

A monolithic metamorphic multi-junction solar cell comprising a first III-V subcell and a second III-V subcell and a third III-V subcell and a fourth Ge subcell, wherein the subcells are stacked on top of each other in the indicated order, and the first subcell forms the topmost subcell, and a metamorphic buffer is formed between the third subcell and the fourth subcell and all subcells each have an n-doped emitter layer and a p-doped base layer, and the emitter layer of the second subcell is greater than the base layer.

14 Claims, 2 Drawing Sheets

(56) References Cited

U.S. PATENT DOCUMENTS

| | | | | |
|---|---|---|---|---|
| 2003/0070707 A1* | 4/2003 | King | H01L 31/02168 | 136/255 |
| 2003/0145884 A1* | 8/2003 | King | H01L 31/0725 | 136/255 |
| 2006/0144435 A1* | 7/2006 | Wanlass | H01L 31/043 | 257/E27.125 |
| 2006/0162768 A1* | 7/2006 | Wanlass | H01L 31/043 | 257/E27.125 |
| 2007/0137698 A1* | 6/2007 | Wanlass | H01L 31/042 | 136/262 |
| 2007/0199592 A1* | 8/2007 | Agui | H01L 31/0735 | 136/256 |
| 2009/0078310 A1* | 3/2009 | Stan | H01L 31/06875 | 136/262 |
| 2009/0229659 A1* | 9/2009 | Wanlass | H01L 31/1852 | 257/E31.003 |
| 2010/0093127 A1* | 4/2010 | Sharps | H01L 31/1844 | 156/60 |
| 2010/0193002 A1* | 8/2010 | Dimroth | H01L 31/1808 | 438/758 |
| 2011/0124146 A1* | 5/2011 | Pitera | H01L 31/0693 | 257/E31.11 |
| 2011/0290312 A1* | 12/2011 | Agui | H01L 31/0693 | 257/E31.003 |
| 2012/0285519 A1* | 11/2012 | Hoffman, Jr | H01L 31/078 | 136/255 |
| 2014/0076388 A1* | 3/2014 | King | H01L 31/0725 | 136/255 |
| 2014/0090700 A1* | 4/2014 | Song | H01L 31/0687 | 438/74 |
| 2014/0246082 A1* | 9/2014 | Juso | H01L 31/184 | 438/93 |
| 2014/0261611 A1* | 9/2014 | King | H01L 31/0687 | 136/262 |
| 2017/0054048 A1 | 2/2017 | Derkacs | | |
| 2017/0170354 A1* | 6/2017 | Ebel | H01L 31/0735 | |
| 2018/0062017 A1* | 3/2018 | Derkacs | H01L 31/0547 | |
| 2018/0226528 A1 | 8/2018 | Hart et al. | | |
| 2018/0240922 A1 | 8/2018 | Derkacs et al. | | |
| 2019/0378948 A1 | 12/2019 | Dimroth et al. | | |
| 2020/0027999 A1 | 1/2020 | Derkacs et al. | | |
| 2020/0194607 A1* | 6/2020 | Fuhrmann | H01L 31/03046 | |

OTHER PUBLICATIONS

Bauhuis et al : "Deep junction III-V solar cells with enhanced performance", Institute for Molecules and Materials, Radboud University, Mar. 11, 2016, DOI: 10.2002/pssa.201532903.

Van Leest et al : "Recent progress of solar cell development for CPV applications at Azur Space", Sep. 11, 2019, pp. 586-589, ISSN: 0094-243X.

Dimroth et al : Wafer bonded four-junction GaInP/GaAs//GaInAsP/GaInAs conenctrator solar cells with 44.7% efficiency, 2014-01013, DOI: 10.1002/pip.2475.

* cited by examiner

MONOLITHIC METAMORPHIC MULTI-JUNCTION SOLAR CELL

This nonprovisional application claims priority under 35 U.S.C. § 119(a) to European Patent Application No. 20000251, which was filed on Jul. 10, 2020, and which is herein incorporated by reference.

BACKGROUND OF THE INVENTION

Field of the Invention

The present invention relates to a monolithic metamorphic multi-junction solar cell. Such multi-junction solar cells are preferably used in outer space or in terrestrial concentrator photovoltaics (CPV) systems. In this case, at least three or more subcells with different bandgaps are stacked on top of each other via tunnel diodes.

Description of the Background Art

The manufacturing of a four-junction solar cell with a subcell made of GaInAsP is known from the printed publication, "Wafer bonded four-junction GaInP/GaAs/GaInAsP/GaInAs concentrator solar cells with 44.7% efficiency" by Dimroth et al. in Progr. Photovolt: Res. Appl. 2014; 22: 277-282. In the aforementioned publication, starting from an InP substrate, a GaInAsP solar cell with an energy bandgap of approx. 1.12 eV is deposited in a lattice-matched manner.

The top subcells with a higher bandgap are manufactured in a second deposition in inverted order on a GaAs substrate. The formation of the entire multi-junction solar cell is accomplished by a direct semiconductor bond of the two epitaxial wafers, with subsequent removal of the GaAs substrate and further process steps. However, the manufacturing process is very complex and cost-intensive.

EP 2 960 950 A1 and EP 3 179 521 A1, which corresponds to US 2017/0170354, which is incorporated herein by reference, and which disclose further multi-junction solar cells with a GaInAsP subcell. Furthermore, upright grown multi-junction cells having, inter alia, a metamorphic buffer, are known from US 2018 0226 528 A1, US 2017 0054 048 A1, DE 10 2018 203 509 A1 and US 2020 0027 999 A1.

Furthermore, further multi-junction cells are known from HÖHN OLIVER ET AL: "Development of Germanium-Based Wafer-Bonded Four-Junction Solar Cells", IEEE JOURNAL OF PHOTOVOLTAICS, Vol. 9, No. 6, Oct. 11, 2019, pp. 1625-1630, from EP 3 179 521 A1, US 2018/240 922 A1, from GERARD BAUHUIS ET AL: "Deep junction III-V solar cells with enhanced performance: Deep junction III-V solar cells "PHYSICA STATUS SOLIDI, Vol. 213, No. 8, Mar. 7, 2016, pages 2216-2222, R. H. VAN LEEST ET AL: "Recent progress of multi-junction solar cell development for CPV applications at AZUR SPACE," PROC. OF THE 36TH EU-PVSEC, Sep. 11, 2019, Pages 586-589, from US 2019/378 948 A1, and U.S. Pat. No. 6,660,928 B1.

The optimization of the radiation hardness, in particular for very high radiation doses, is an important goal in the development of space solar cells. The aim is not only to increase the initial or beginning-of-life (BOL) efficiency but also the end-of-life (EOL) efficiency.

Furthermore, manufacturing costs are of critical importance. The industrial standard at the present time is determined by lattice-matched triple-junction solar cells and the metamorphic GaInP/GaInAs/Ge triple-junction solar cell.

SUMMARY OF THE INVENTION

It is therefore an object of the present invention to provide an apparatus that advances the state of the art.

In an exemplary embodiment of the invention, a monolithic multi-junction solar cell comprising a first III-V subcell and a second III-V subcell and a third III-V subcell and a fourth Ge subcell is provided.

The subcells are stacked in the specified order.

The first subcell can form the top subcell.

A metamorphic buffer can be formed between the third subcell and the fourth subcell.

All subcells each can have an n-doped emitter layer and a p-doped base layer.

It should also be noted that the terms emitter and base can refer to either the n-doped or the p-doped layers in the respective subcell, in other words, the emitter layer and the base layer.

The topmost layer of a subcell, i.e., the emitter layer in this case, can be formed as an n-layer. This means that the light in a subcell always passes first through the emitter layer and then through the base layer.

In the first, third and fourth subcells, the emitter layer can be many times thinner than the base layer. In the second subcell, however, the thickness of the emitter layer can be greater than the thickness of the base layer.

In existing multi-junction solar cells, in particular in the field of multi-junction solar cells, the approach is surprising. The reason for this is that the mobility of the minorities in the n-doped emitter layer, i.e., the holes, is about one order of magnitude lower than that of the electrons. Another reason is the degradation of the minority carrier lifetime in the base and emitter layers during use due to the incident cosmic radiation.

It should also be noted that the metamorphic buffer can be used to compensate for the differences in lattice constants between the fourth cell and the third cell. Here, the metamorphic buffer consists of at least three III-V layers. The described multi-junction solar cell is a so-called UMM (upright metamorphic multi-junction) multi-junction solar cell.

An advantage is that the described apparatus surprisingly shows less degradation. In other words, the reduction of the efficiency under irradiation is reduced less, i.e., the EOL (end of life) efficiency increases as compared to the previous values.

In an example, no semiconductor bond is formed between the four subcells, in particular it is included that no direct semiconductor bond is formed between any two subcells of the multi-junction solar cell.

The multi-junction solar cell being formed from one stack means that the stack of the multi-junction solar cell is not formed from two partial stacks which have been deposited on different substrates and subsequently bonded together via a semiconductor bond. In particular, the solar cell stack does not have any amorphous interlayers, as they can occur during bonding.

It is noted that the sunlight is always irradiated first through the topmost subcell with the largest bandgap. In other words, the solar cell stack first absorbs the shortwave part of the light with the topmost subcell. The bandgap decreases from the first subcell to the fourth subcell, with the bandgap of the fourth subcell being approx. 0.67 eV.

In the present case, the photons first pass through the first subcell and then through the second subcell, followed by the third subcell and finally the fourth subcell. Preferably, a tunnel diode is formed between two immediately successive subcells.

In an equivalent circuit diagram, the individual subcells of the multi-junction solar cell, as p/n diodes with intermediate tunnel diodes, can be understood as being connected in series. This means that the subcell with the lowest current has a limiting effect, in other words, it is advantageous to current match the individual subcells to each other.

The thickness of the emitter layer of the second subcell can be greater than 600 nm.

Our own studies surprisingly showed that the degradation of the charge carrier lifetime in p-InGaAsP in the mentioned compositional range, contrary to expectation, is high under electron beam irradiation. It is all the more astonishing that very little degradation was found in the case of n-doped InGaAsP.

The base layer of the second subcell can have a thickness of less than 450 nm and/or a doping of greater than $4·10^{17}/cm^3$. Alternatively, the base layer of the second subcell has a thickness less than 200 nm and/or a doping greater than $8·10^{17}/cm^3$.

The emitter layer of the second subcell comprises or consists of InGaAsP.

It should be noted that herein, the chemical abbreviations of elements are used synonymously with the full words.

The emitter layer of the second subcell can have an arsenic content based on the elements of the main group V of between 22% and 33% and an indium content based on the elements of the main group III of between 52% and 65%. In a further development, the lattice constant of the base layer is between 0.572 nm and 0.577 nm.

The arsenic content indicated can be based on the total content of the group V atoms. Accordingly, the indicated indium content is based on the total content of the group III atoms. This means that for the compound $Ga_{1-X}In_XAs_YP_{1-Y}$, the indium content is the value X and the arsenic content the value Y, and thus for an arsenic content of, e.g., 25%, a Y-value of 0.25 results.

Surprisingly, studies have shown that InGaAsP can be deposited in the above-mentioned composition range by MOVPE with surprisingly good quality. This overcomes the prejudice that InGaAsP cannot be deposited in the composition range mentioned, which lies within the miscibility gap, with the quality required for solar cells.

This is all the more surprising since our own studies show that InGaAsP deposited with MOVPE does indeed exhibit the miscibility gap or segregation found in the literature in other compositional ranges. This means, in the compositional range mentioned, special effects seem to be present which prevent or mitigate segregation.

A passivation layer of a compound with at least the elements GaInP or with at least the elements AlInP can be provided above the layer of the second subcell and below the first subcell. In other words, the passivation layer is formed between the first subcell and the second subcell.

The lattice constant of the first subcell can differ from the lattice constant of the third subcell by less than 0.3% or less than 0.2%. In other words, the third subcell and the second subcell and the first subcell are lattice matched to each other.

A passivation layer of a compound with at least the elements GaInP, or with at least the elements AlInP, can be arranged below the layer of the second subcell and above the metamorphic buffer.

The second subcell and/or the further subcells do not have a multiple quantum well structure.

The second subcell SC2 can be designed as a homocell. In this case, the term homocell can refer to a cell in which the emitter layer contains the same elements with the same stoichiometry as the base layer.

The emitter layer and the base layer of the second subcell can each comprise or consist of InGaAsP.

The second subcell can be designed as a heterocell. For example, the emitter layer of the second subcell can comprise or consists of InGa(As)P or InGa(As)P. The base layer can comprise InGaP or AlInGaP or InAlP or AlInAs or consists of InGaP or of AlInGaP or InAlP or AlInAs.

A passivation layer of AlInAs or AlInGaAs of the second subcell SC2 can be arranged below the base layer in the direction towards the third subcell SC3.

The emitter doping of the second subcell can be less than the base doping by at least a factor of 3 or at least a factor of 5 or at least a factor of 8.

The emitter layer of the second solar cell can have a first region and a second region, wherein the first region has a different magnitude of doping than the second region, and the second region is formed closer to the base than the first region.

For example, the doping in the first region can increase by more than $3·10^{17}/cm^3$ in the direction of the first solar cell.

The second region of the second solar cell can have a thickness greater than 150 nm and a doping less than $1·10^{16}/cm^3$.

Alternatively, the second region can have a thickness greater than 250 nm and a doping less than $5·10^{15}/cm^3$.

The lower region of the second subcell in the direction of the third subcell can have a thickness greater than 150 nm and/or a doping of less than $1·10^{16}/cm^3$. Alternatively, in the second subcell, the lower region of the emitter layer in the direction of the third subcell has a thickness greater than 250 nm and a doping of less than $5·10^{15}/cm^3$.

The base layer of the second subcell at least partially comprises the dopants Zn or C or Mg. For example, the emitter layer at least partially comprises the dopants Si or Te or Se or Ge.

The base layer of the second subcell can be doped with carbon. Alternatively, the carbon concentration in the base layer is higher than the zinc concentration.

The first subcell can have a greater bandgap than the second subcell. The second subcell can have a greater bandgap than the third subcell. The third subcell can have a greater bandgap than the fourth subcell.

The first subcell can have a bandgap in a range between 1.85 eV and 2.07 eV and the second subcell can have a bandgap in a range between 1.41 eV and 1.53 eV and the third subcell can have a bandgap in a range between 1.04 eV and 1.18 eV.

The first subcell can comprise a compound of at least the elements AlInP. The indium content in relation to the elements of the main group III is between 64% and 75% and the Al content is between 18% and 32%.

The third subcell can have a compound of at least the elements InGaAs. The indium content in relation to the elements of the main group III is above 17%.

A semiconductor mirror can be arranged between the third subcell and the fourth subcell. By incorporating a semiconductor mirror, the thickness of the base layer can be reduced in a range between 50% and 90% as compared to the thickness of the base layer without the semiconductor mirror.

A passivation layer of a compound having at least the elements GaInP or having at least the elements AlInAs or having at least the elements AlInP can be arranged above the layer of the second subcell and below the first subcell.

A passivation layer of a compound having at least the elements GaInP or having at least the elements AlInP can be arranged below the layer of the second subcell and above the metamorphic buffer.

Exactly four subcells or exactly five subcells can be provided, wherein in a multi-junction solar cell with five subcells, a fifth subcell can be formed between the first subcell and the second subcell.

The fifth subcell can have a larger bandgap than the second subcell and a smaller bandgap than the first subcell. The fifth subcell can be lattice matched to the second subcell.

The thickness of the emitter layer of the fifth subcell can be less than the thickness of the base layer.

In a further development, the emitter layer of the second subcell has an antimony content less than 1%.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
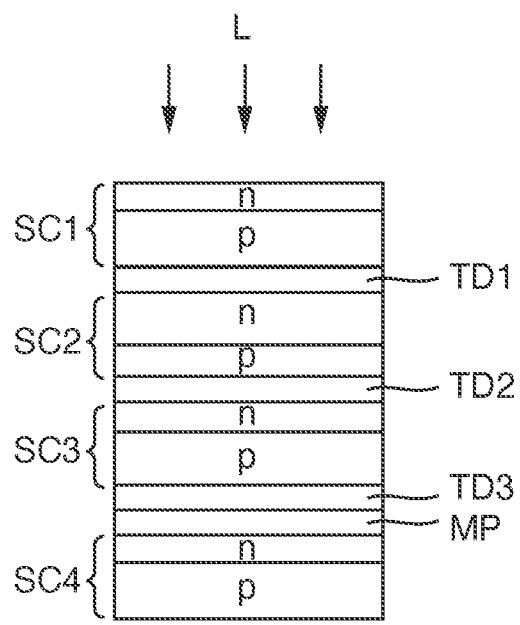
FIG. 1 is a view of an example of a monolithic metamorphic multi-junction solar cell.

FIG. 1 shows a first embodiment of a monolithic metamorphic multi-junction solar cell with a first upper subcell SC1 on an underlying second subcell SC2. When irradiated, the light L first strikes the upper surface of the first subcell SC1.

An upper tunnel diode TD1 is formed between the first subcell SC1 and the second subcell SC2.

A third subcell SC3 is arranged below the second subcell SC2. Between the second subcell SC2 and the third subcell SC3, a second tunnel diode TD2 is formed.

A fourth subcell SC4 is arranged below the third subcell SC3. A third tunnel diode TD3 is formed between the third subcell SC3 and the fourth subcell SC4.

A metamorphic buffer MP is arranged between the fourth subcell SC4 and the third tunnel diode TD3.

Each of the subcells SC1, SC2, SC3, and SC4 has an n-doped emitter layer which is materially bonded to a p-doped base layer.

The thickness of the emitter layer at the first, third and fourth subcells SC1, SC3, SC4 is in each case less than the thickness of the associated base layer.

In the second subcell SC2, the thickness of the emitter layer is greater than the thickness of the base layer.

Figure 2:
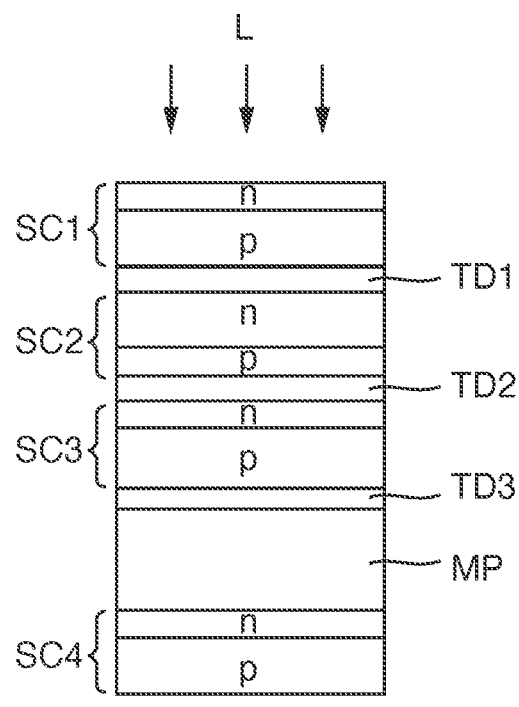
FIG. 2 is a view of an example of a monolithic metamorphic multi-junction solar cell.

FIG. 2 shows a second embodiment of a four-junction solar cell. In the following, only the differences to the first embodiment are explained.

The second subcell SC2 has an emitter made of InGaP and a base made of InGaAsP, i.e., the emitter has a ternary compound in contrast to the quaternary compound in the base. As a result, the second subcell SC2 is designed as a so-called heterocell.

Figure 3:
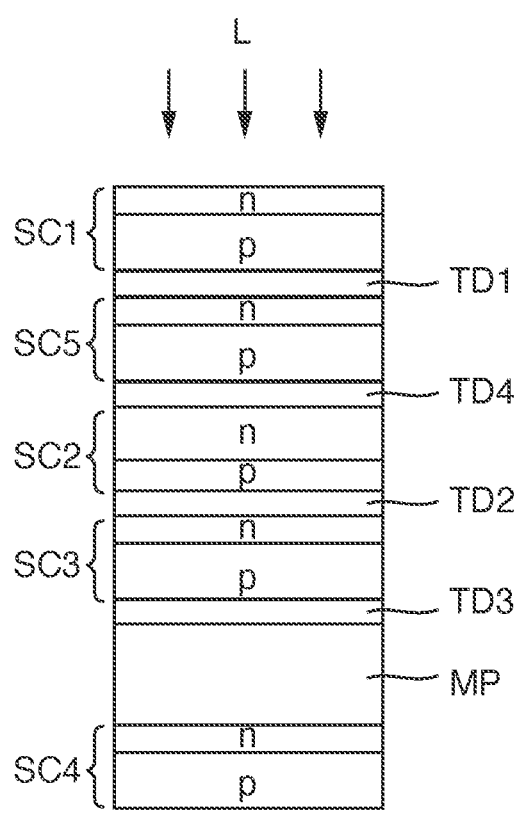
FIG. 3 is a view of an example of a monolithic metamorphic multi-junction solar cell.

FIG. 3 shows a third embodiment of a four-junction solar cell. In the following, only the differences to the preceding embodiments are explained.

A fifth subcell SC5 is arranged between the first subcell SC1 and the second subcell SC2. A fourth tunnel diode TD4 is arranged between the fifth subcell SC5 and the second subcell SC2. The fifth subcell SC5 is lattice matched to both the second and third subcells.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A monolithic metamorphic multi-junction solar cell comprising:
    a first III-V subcell;
    a second III-V subcell;
    a third III-V subcell;
    a fourth Ge subcell, wherein the first, second, third, and fourth subcells being stacked in the indicated order, the first subcell forming topmost subcell, and the first, second, third, and fourth subcells each have an n-doped emitter layer and a p-doped base layer;
    a metamorphic buffer formed between the third subcell and the fourth subcell;
    a first tunnel diode formed between the first subcell and the second subcell;
    a second tunnel diode formed between the second subcell and the third subcell; and
    a third tunnel diode formed between the third subcell and the fourth subcell,
    wherein a thickness of the emitter layer of each of the first, third and fourth subcells is less than a thickness of the associated base layer of each of the first, third and fourth subcells, respectively,
    wherein, in the second subcell, a thickness of the emitter layer is greater than a thickness of the base layer,
    wherein the emitter layer of the second subcell comprises or consists of InGaAsP, and
    wherein the first subcell comprises a compound of at least the elements AlInP.

2. The monolithic metamorphic multi-junction solar cell according to claim 1, wherein the thickness of the emitter layer of the second subcell has a thickness greater than 600 nm.

3. The monolithic metamorphic multi-junction solar cell according to claim 1, wherein the base layer of the second subcell has a thickness less than 450 nm and/or a doping greater than $4 \cdot 10^{17}/cm^3$.

4. The monolithic metamorphic multi-junction solar cell according to claim 1, wherein the emitter layer of the second subcell has an arsenic content based on the elements of main group V of between 22% and 33% and an indium content based on the elements of the main group III between 52% and 65%, and the lattice constant of the emitter layer is between 0.572 nm and 0.577 nm.

5. The monolithic metamorphic multi-junction solar cell according to claim 1, wherein the second subcell is designed as a heterocell.

6. The monolithic metamorphic multi-junction solar cell according to claim 1, wherein the base layer of the second subcell comprises InGaAsP or InGaP or AlInGaP or InAlP or AlInAs, or consists of InGaAsP or InGaP or AlInGaP or InAlP or AlInAs.

7. The monolithic metamorphic multi-junction solar cell according to claim 1, wherein the first subcell has a bandgap in a range between 1.85 eV and 2.07 eV and the second subcell has a bandgap in a range between 1.41 eV and 1.53 eV and the third subcell has a bandgap in a range between 1.04 eV and 1.18 eV.

8. The monolithic metamorphic multi-junction solar cell according to claim 1, wherein in the first subcell, indium content based on the elements of the main group III is between 64% and 75% and Al content is between 18% and 32%.

9. The monolithic metamorphic multi-junction solar cell according to claim 1, wherein a semiconductor mirror is arranged between the third subcell and the fourth subcell.

10. The monolithic metamorphic multi-junction solar cell according to claim 1, wherein the emitter layer of the second subcell at least partially has a dopant gradient and the dopant concentration in the direction of the first subcell increases to more than $3 \cdot 10^{17}/cm^3$.

11. The monolithic metamorphic multi-junction solar cell according to claim 1, wherein the emitter layer of the second subcell comprises a first region and a second region, the first region having a different magnitude of doping than the second region and the second region being formed closer to the base than the first region.

12. The monolithic metamorphic multi-junction solar cell according to claim 1, wherein exactly four subcells or exactly five subcells are provided, or wherein a fifth subcell is formed between the first subcell and the second subcell.

13. The monolithic metamorphic multi-junction solar cell according to claim 1, wherein the base layer of the second subcell is doped with carbon and/or that the carbon concentration in the base layer of the second solar cell is higher than the zinc concentration.

14. The monolithic metamorphic multi-junction solar cell according to claim 1, wherein emitter doping of the second subcell is less than base doping by at least a factor of 3.

* * * * *